(12) United States Patent
Ciulla et al.

(10) Patent No.: US 9,417,017 B2
(45) Date of Patent: Aug. 16, 2016

(54) HEAT TRANSFER APPARATUS AND METHOD

(71) Applicants: Anthony Ciulla, Mountville, PA (US); Nelson Gernert, Elizabethtown, PA (US); Mark T. North, Lancaster, PA (US); Donald Wood, Chadds Ford, PA (US); Smita Agrawal, Pearland, TX (US); Tianhong Cui, Vadnais Heights, MN (US); Longzhong Huang, Minneapolis, MN (US); Vinnee Bharathi A. Selvi, Lancaster, PA (US); Terrence W. Simon, Minneapolis, MN (US); Taiho Yeom, Minneapolis, MN (US); Youmin Yu, San Diego, CA (US); Min Zhang, Guangdong (CN); Congshun Wang, Reading, MA (US); Xuelin Zhu, AnHui (CN); Tao Zhang, Alexandria, MN (US)

(72) Inventors: Anthony Ciulla, Mountville, PA (US); Nelson Gernert, Elizabethtown, PA (US); Mark T. North, Lancaster, PA (US); Donald Wood, Chadds Ford, PA (US); Smita Agrawal, Pearland, TX (US); Tianhong Cui, Vadnais Heights, MN (US); Longzhong Huang, Minneapolis, MN (US); Vinnee Bharathi A. Selvi, Lancaster, PA (US); Terrence W. Simon, Minneapolis, MN (US); Taiho Yeom, Minneapolis, MN (US); Youmin Yu, San Diego, CA (US); Min Zhang, Guangdong (CN); Congshun Wang, Reading, MA (US); Xuelin Zhu, AnHui (CN); Tao Zhang, Alexandria, MN (US)

(73) Assignee: Thermal Corp., Wilmington, DE (US)

( * ) Notice: Subject to any disclaimer, the term of this patent is extended or adjusted under 35 U.S.C. 154(b) by 706 days.

(21) Appl. No.: 13/828,625

(22) Filed: Mar. 14, 2013

(65) Prior Publication Data
US 2014/0060783 A1     Mar. 6, 2014

Related U.S. Application Data
(60) Provisional application No. 61/613,327, filed on Mar. 20, 2012.

(51) Int. Cl.
*H01L 23/467*     (2006.01)
*H01L 23/367*     (2006.01)
(Continued)

(52) U.S. Cl.
CPC ............... *F28F 13/12* (2013.01); *F04B 43/046* (2013.01); *F28F 13/125* (2013.01); *H01L 23/3677* (2013.01); *H01L 23/467* (2013.01); *H01L 2924/0002* (2013.01)

(58) Field of Classification Search
CPC ....... F28F 13/12; F28F 13/125; F04B 43/046; H01L 23/3677; H01L 23/467
USPC ............................................ 165/80.3, 125, 126
See application file for complete search history.

(56) References Cited

U.S. PATENT DOCUMENTS

| 4,420,826 A | 12/1983 | Marshall, Jr. et al. |
| 4,754,441 A | 6/1988 | Butler |
| 4,845,687 A | 7/1989 | Bromfield |

(Continued)

FOREIGN PATENT DOCUMENTS

| CA | 1333419 | 12/1994 |
| DE | 19643180 | 10/1996 |

(Continued)

OTHER PUBLICATIONS
Chilibon, Underwater flextensional piezoceramic sandwich transducer (2002) Sensors and Actuators A 100, pp. 287-292.

*Primary Examiner* — Tho V Duong
(74) *Attorney, Agent, or Firm* — Michael Best & Friedrich LLP

(57) ABSTRACT

A method is provided for heat transfer from a surface to a fluid. The method includes directing a first fluid flow towards the surface in a first direction and directing a second fluid flow towards the surface in a second direction. The first and second fluid flows cooperate to cool the surface.

11 Claims, 14 Drawing Sheets

(51) Int. Cl.
*F28F 13/12* (2006.01)
*F04B 43/04* (2006.01)

(56) References Cited

U.S. PATENT DOCUMENTS

| | | | |
|---|---|---|---|
| 4,845,688 A | 7/1989 | Butler | |
| 4,947,595 A | 8/1990 | Douds et al. | |
| 4,964,106 A | 10/1990 | Bromfield | |
| 5,155,709 A | 10/1992 | Flanagan et al. | |
| 5,195,576 A * | 3/1993 | Hatada | F28F 3/022 165/185 |
| 5,291,461 A | 3/1994 | Boeglin et al. | |
| 5,309,983 A * | 5/1994 | Bailey | H01L 23/40 165/122 |
| 5,337,461 A | 8/1994 | Falcus | |
| 5,345,428 A | 9/1994 | Arnold et al. | |
| 5,363,346 A | 11/1994 | Maltby | |
| 5,422,787 A | 6/1995 | Gourdine | |
| 5,431,058 A | 7/1995 | Lagier et al. | |
| 5,497,357 A | 3/1996 | Dahlstrom et al. | |
| 5,518,758 A | 5/1996 | Tiburtius et al. | |
| 5,546,361 A | 8/1996 | Boucher et al. | |
| 5,566,132 A | 10/1996 | Janus et al. | |
| 5,758,823 A | 6/1998 | Glezer et al. | |
| 5,768,216 A | 6/1998 | Obata et al. | |
| 5,825,624 A | 10/1998 | Arnold et al. | |
| 5,894,990 A | 4/1999 | Glezer et al. | |
| 5,896,917 A | 4/1999 | Lemont et al. | |
| 5,943,211 A | 8/1999 | Havey et al. | |
| 6,123,145 A | 9/2000 | Glezer et al. | |
| 6,181,556 B1 * | 1/2001 | Allman | G06F 1/20 165/185 |
| 6,400,649 B2 | 6/2002 | Skinner et al. | |
| 6,550,531 B1 | 4/2003 | Searls et al. | |
| 6,729,383 B1 | 5/2004 | Cannell et al. | |
| 6,736,204 B2 | 5/2004 | Gollan et al. | |
| 6,842,340 B2 | 1/2005 | Chang | |
| 6,927,528 B2 | 8/2005 | Barillot et al. | |
| 6,936,953 B2 | 8/2005 | Cousy et al. | |
| 6,978,827 B2 | 12/2005 | Armstrong | |
| 7,198,094 B2 * | 4/2007 | Barsun | F28F 3/02 165/104.34 |
| 7,251,139 B2 | 7/2007 | Bhattacharya et al. | |
| 7,252,140 B2 | 8/2007 | Glezer et al. | |
| 7,336,486 B2 | 2/2008 | Mongia | |
| 7,461,690 B2 | 12/2008 | Bhatti | |
| 7,556,406 B2 | 7/2009 | Petroski et al. | |
| 7,584,780 B1 | 9/2009 | Lemont et al. | |
| 7,588,074 B1 | 9/2009 | White | |
| 7,607,470 B2 | 10/2009 | Glezer et al. | |
| 7,760,499 B1 | 7/2010 | Darbin et al. | |
| 7,814,965 B1 | 10/2010 | Spokoiny et al. | |
| 7,990,705 B2 | 8/2011 | Bult et al. | |
| 8,063,539 B2 | 11/2011 | Janker et al. | |
| 2002/0167798 A1 * | 11/2002 | Jui-Yuan | H01L 23/3672 361/697 |
| 2006/0185822 A1 | 8/2006 | Glezer et al. | |
| 2006/0196638 A1 | 9/2006 | Glezer et al. | |
| 2007/0119573 A1 | 5/2007 | Mahalingam et al. | |
| 2008/0038163 A1 | 2/2008 | Boege et al. | |
| 2008/0043061 A1 | 2/2008 | Glezer et al. | |
| 2009/0084866 A1 | 4/2009 | Grimm et al. | |
| 2009/0109625 A1 | 4/2009 | Booth et al. | |
| 2009/0321044 A1 | 12/2009 | Hernon et al. | |
| 2010/0034638 A1 | 2/2010 | Chambers et al. | |
| 2010/0039012 A1 | 2/2010 | Grimm | |
| 2010/0090577 A1 | 4/2010 | Reed et al. | |
| 2010/0091463 A1 | 4/2010 | Buresch et al. | |
| 2010/0110630 A1 | 5/2010 | Arik et al. | |
| 2010/0110635 A1 | 5/2010 | Jones et al. | |
| 2010/0124058 A1 | 5/2010 | Miller | |
| 2010/0258270 A1 | 10/2010 | Arik et al. | |
| 2010/0258274 A1 | 10/2010 | Van Der Tempel et al. | |
| 2011/0024092 A1 | 2/2011 | Gerlach | |
| 2011/0089830 A1 | 4/2011 | Pickard et al. | |
| 2011/0110108 A1 | 5/2011 | Calon et al. | |
| 2011/0114287 A1 | 5/2011 | Arik et al. | |
| 2011/0122579 A1 | 5/2011 | Huisman et al. | |
| 2011/0139429 A1 | 6/2011 | Salapakkam et al. | |
| 2011/0162823 A1 | 7/2011 | Sharma et al. | |
| 2011/0174462 A1 | 7/2011 | Arik et al. | |
| 2011/0180238 A1 | 7/2011 | Vetrovec | |

FOREIGN PATENT DOCUMENTS

| | | |
|---|---|---|
| JP | 61042284 | 2/1986 |
| JP | 2006302918 | 11/2006 |
| JP | 2010114174 | 5/2010 |
| JP | 2010239165 | 10/2010 |

\* cited by examiner

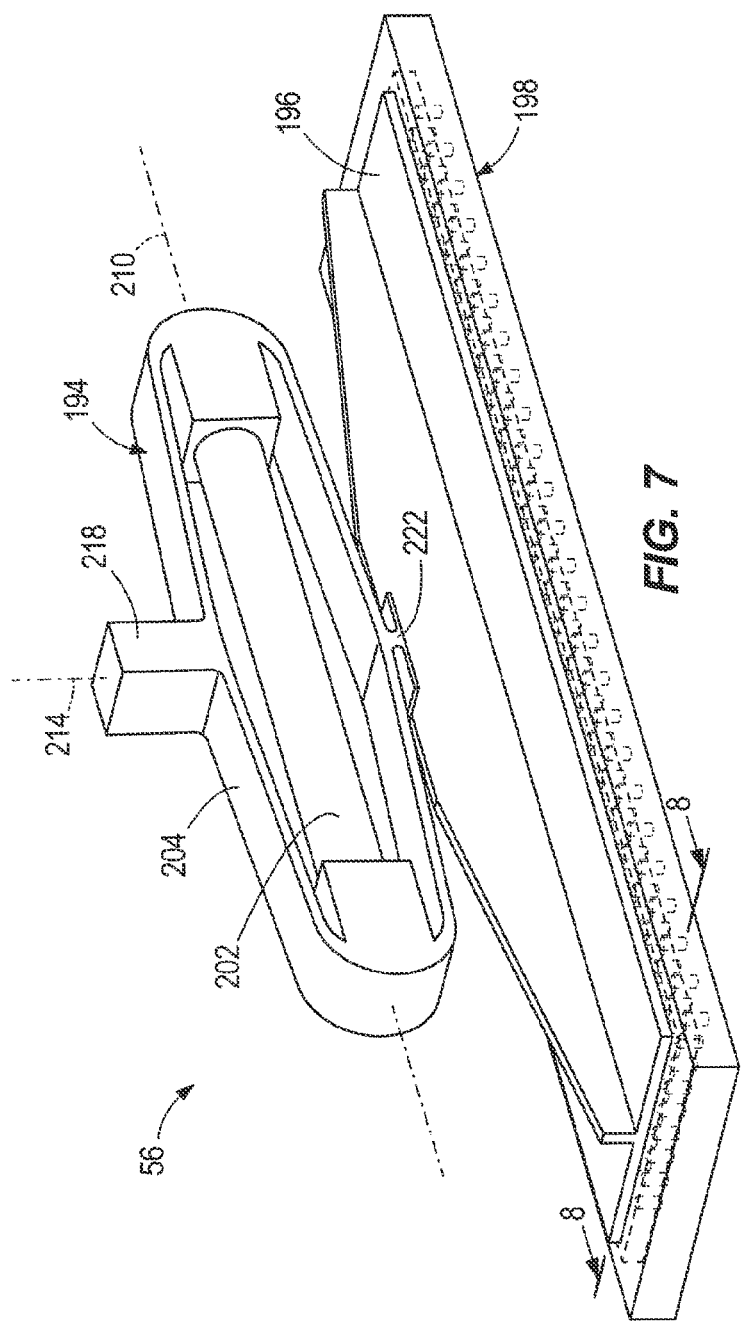
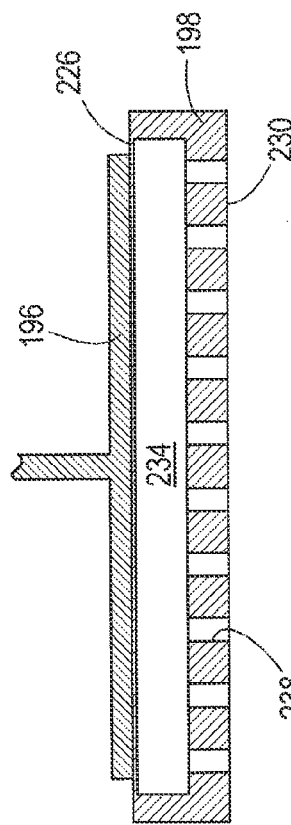
FIG. 7
FIG. 8

HEAT TRANSFER APPARATUS AND METHOD

CROSS-REFERENCE TO RELATED APPLICATIONS

This application claims priority to U.S. Provisional Patent Application No. 61/613,327 filed Mar. 20, 2012, the content of which is incorporated herein by reference in its entirety.

FEDERALLY SPONSORED RESEARCH

This invention was made with government support under contract number W31P4Q-09-C-0028 awarded by the U.S. Army Contracting Command. The government has certain rights in the invention.

BACKGROUND

The present invention relates to heat transfer.

More specifically, the present invention relates to an apparatus and method for improving heat transfer from a heat source to a fluid flow. The rate of heat transfer from a heat transfer surface, such as a heat sink, to a fluid, such as air, is affected by flow conditions at the surface. Turbulent flow generally results in a higher heat transfer rate than laminar flow.

SUMMARY

In one embodiment, the invention provides a heat transfer apparatus. A surface exchanges heat from a heat source to a fluid. A first fluid driver drives a first portion of the fluid along the surface in a first direction. A second fluid driver drives a second portion of the fluid along the surface in a second direction. A third fluid driver drives a third portion of the fluid along the surface in a third direction. Each of the first direction, the second direction, and the third direction are substantially non-parallel to one another.

In another embodiment, the invention provides a heat transfer apparatus. A first wall of the apparatus has a first base portion, a first end portion, and a first surface extending between the first base portion and the first end portion. A second wall has a second base portion, a second end portion, and a second surface extending between the second base portion and the second end portion. The first surface and the second surface at least partially define a channel for heat exchange with a heat source. The heat source is thermally coupled to the first wall and the second wall, and a fluid. A first fluid driver drives a first portion of the fluid through the channel in a first direction. A second fluid driver drives a second portion of the fluid through the channel in a second direction. A third flow fluid driver driving a third portion of the fluid through the channel in a third direction. Each of the first direction, the second direction, and the third direction are substantially non-parallel.

In another embodiment, the invention provides a method for heat transfer from a surface to a fluid. The method includes directing a first fluid flow towards the surface in a first direction and directing a second fluid flow towards the surface in a second direction. The first and second fluid flows cooperate to cool the surface.

In another embodiment the invention provides a method for heat transfer from a surface to a fluid. The method includes driving a first portion of the fluid along the surface on a first axis that is substantially parallel to the surface. A second portion of the fluid is agitated with an agitator reciprocating on a second axis that is substantially non-parallel with the first axis. A third portion of the fluid is injected along a third axis that is substantially non-parallel with the first axis and second axis.

In another embodiment, the invention provides a heat transfer surface. A substrate has. A plurality of surface modification members are coupled to the surface. The surface modification members include a body structure projecting from the surface. The body structure has a base end and a distal end. The base end is coupled to the substrate and the distal end is wider than the base end.

In another embodiment, the invention provides a heat transfer surface. A substrate has a surface. An array of surface modification members are coupled to the surface. The surface modification members include a cylindrical body with a base end and a distal end. The base end is coupled to the substrate. A dome-shaped end-cap is coupled to the distal end.

In another embodiment, the invention provides a method of fabricating surface modification members on a substrate. The method includes depositing a titanium layer over the substrate and applying a photoresist over the titanium layer. The photoresist is selectively exposed to cure the selected portions of the photoresist. Uncured portions of the photoresist are removed. Portions of the titanium layer exposed when removing the uncured portions of the photoresist are removed, thereby exposing the substrate in a desired pattern. The exposed substrate is plated to form surface modification members. The remaining portions of photoresist and titanium are removed to exposed the surface modifications members.

Other aspects of the invention will become apparent by consideration of the detailed description and accompanying drawings.

BRIEF DESCRIPTION OF THE DRAWINGS

FIG. 7 is a perspective view of a synthetic jet assembly of the heat transfer apparatus of FIG. 2.

FIG. 8 is a cross-sectional view of a portion of the synthetic jet assembly of FIG. 7.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

In various embodiments, the invention includes methods and apparatus for improving heat transfer from a surface. The methods and apparatus include modifications of the surface as well as the use of multiple directions of fluid flow in a cooperating manner to improve heat transfer. Without being limited as to theory, the methods and apparatus disclosed herein are believed to improve heat transfer by interfering with laminar flow at the surface, for example by inducing turbulent air flow.

Figure 1:
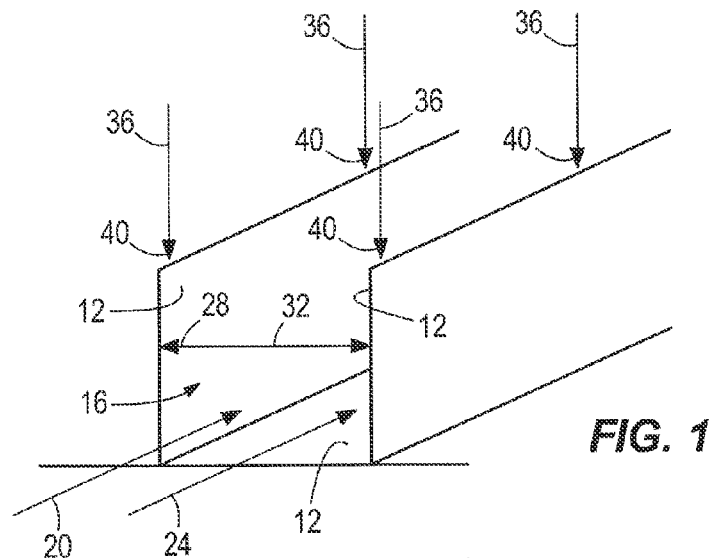
FIG. 1 is a perspective view of a heat transfer apparatus according to one aspect of the invention.

FIG. 1 shows an embodiment of the invention in which multiple cooperating air flows are used to improve heat transfer from a surface. More specifically, FIG. 1 illustrates the combined, simultaneous operation of a first fluid driver (e.g., a bulk air mover such as a fan or blower), a second fluid driver (e.g., an agitator assembly), and a third fluid driver (e.g., a synthetic jet assembly) around a pair of heat transfer surfaces 12 defining a primary flow channel 16. The first fluid driver causes a bulk airflow 20 to flow along (e.g. substantially parallel to) a primary flow axis 24. The second fluid driver generates secondary flow 28 along a secondary flow axis 32 that is different from (e.g. substantially perpendicular to) the primary flow axis 24. The third fluid driver generates tertiary airflow 36 along axes 40 that are different from (e.g. substantially perpendicular to) the primary flow axis 24 and the secondary flow axis 32.

As stated above, it is believed that the secondary flow 28 and tertiary flow 36 over the heat transfer surfaces 12 increase heat transfer to the bulk airflow 20 along the primary flow axis 24 by substantially reducing laminar flow conditions along the heat transfer surfaces 12. In various alternative embodiments, the first, second, and third axes may be at varying angles with respect to one another, for example in a range of 45-90 degrees apart, although the three axes do not have to all be at the same angle with respect to the others.

Figure 2:
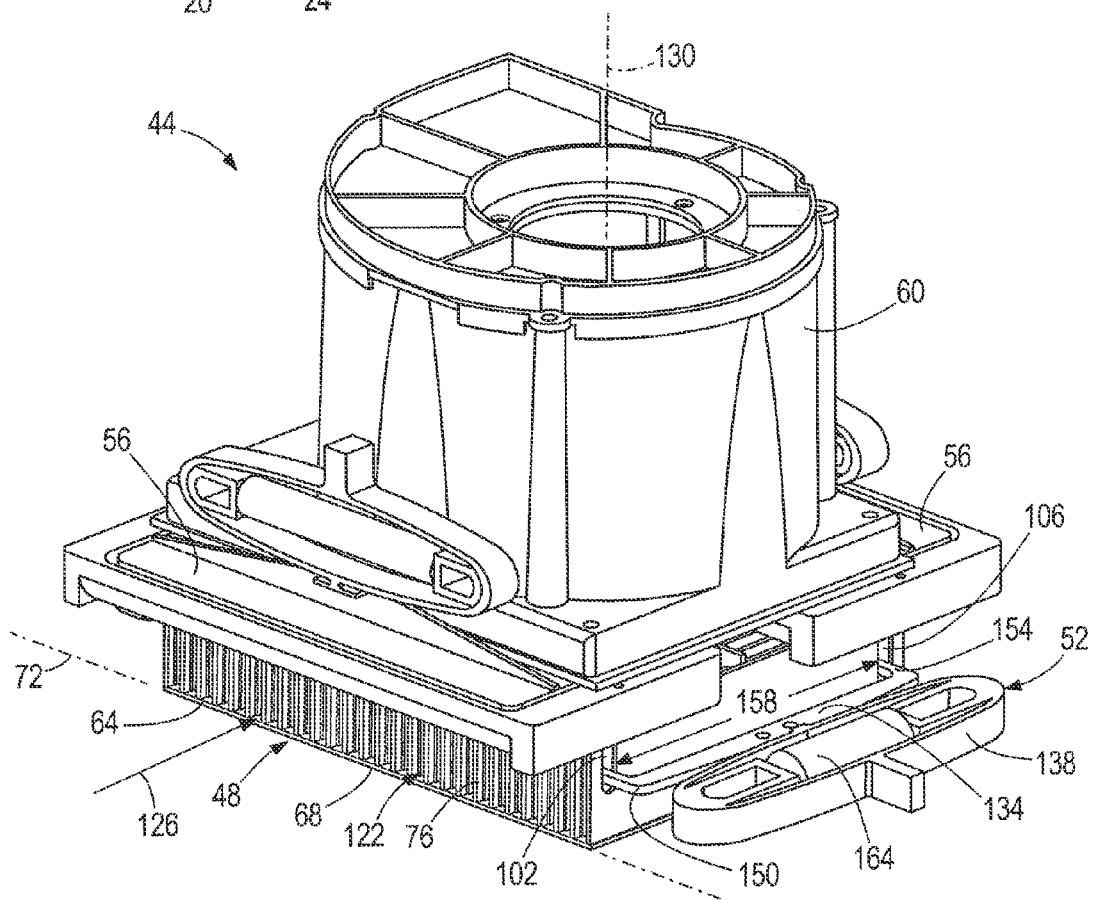
FIG. 2 is a perspective view of a heat transfer apparatus according to another aspect of the invention.

Referring to FIG. 2, a heat transfer apparatus 44 is illustrated. The heat transfer apparatus 44 includes a heat sink assembly 48, an agitator assembly 52, synthetic jet assemblies 56, and a blower 60.

The heat sink assembly 48 includes a base wall 64 having an engagement surface 68. The base wall 64 is oriented along a base plane 72. The engagement surface 68 may be coupled to a heat source, such as a printed circuit board (PCB), a micro-processor, a flat-screen display, or other device that generates heat during operation.

Figure 5:
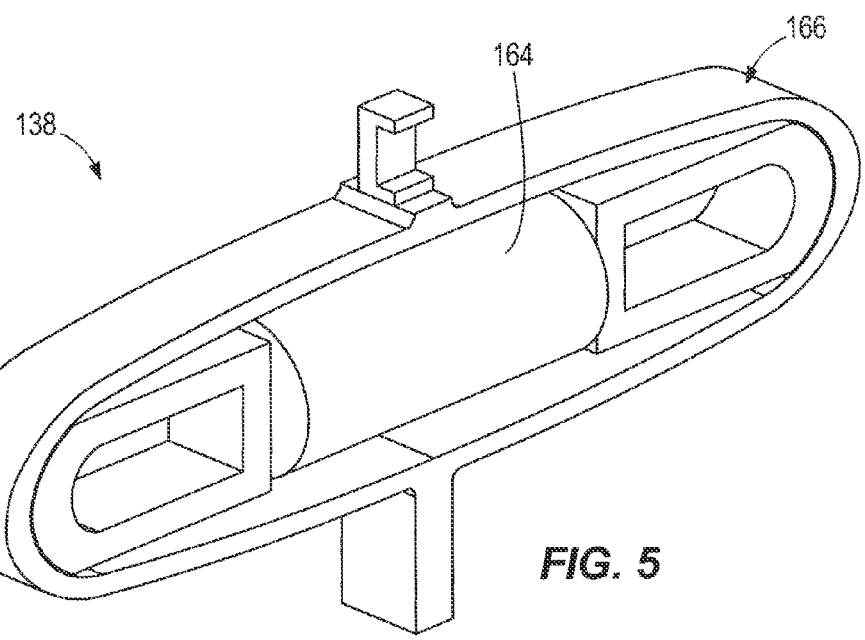
FIG. 5 is a perspective view of an agitator actuator of the heat transfer apparatus of FIG. 2.

Referring to FIG. 5, opposite the engagement surface 68, a plurality of fin walls 76 extend from the base wall 64 in cantilever fashion. Each fin wall 76 extends from a base end 80, coupled to the base wall 64, to a distal end 84. Heat transfer surfaces 88 are defined between the base end 80 and the distal end 84 on two sides of each fin wall 76. Each fin wall 76 further defines a first agitator cutout 90, a second agitator cutout 92, and a central cutout 96 disposed between the first agitator cutout 90 and the second agitator cutout 92. The first agitator cutouts 90 of the fin walls 76 are substantially aligned, and define a first agitator channel 102. The second agitator cutouts 92 of the fin walls 76 are substantially aligned, and define a second agitator channel 106. The central cutouts 96 are substantially aligned, and collectively define central cavity 110.

The central cavity 110 divides the fin walls 76 into two opposing groups 114 and 118. Primary airflow channels 122 are defined between adjacent fin walls 76 of each group 114 and 118, with opposing directions of airflow corresponding to the opposing groups. The primary airflow 122 channels terminate in the central cavity 110. In some embodiments, a flow director may be disposed within the central cavity 110 for redirecting flow from the primary airflow channels 122 towards the blower assembly 60 (FIG. 2).

Referring back to FIG. 2, the blower assembly 60 draws bulk airflow 126 through the heat sink assembly 48 along the primary airflow channels 122 defined between the fin walls 76. In the central cavity 110 (FIG. 3), the bulk airflow is redirected along a blower axis 130 (FIG. 2) that is substantially perpendicular to the primary airflow channels 122. The blower assembly 60 may be an axial-type blower or a centrifugal-type blower or other mechanism for inducing bulk air flow. While the illustrated embodiments show the blower pulling bulk air flow 126 through the fin assembly, in some embodiments, hulk air flow may be pushed through the fins.

Figure 4:
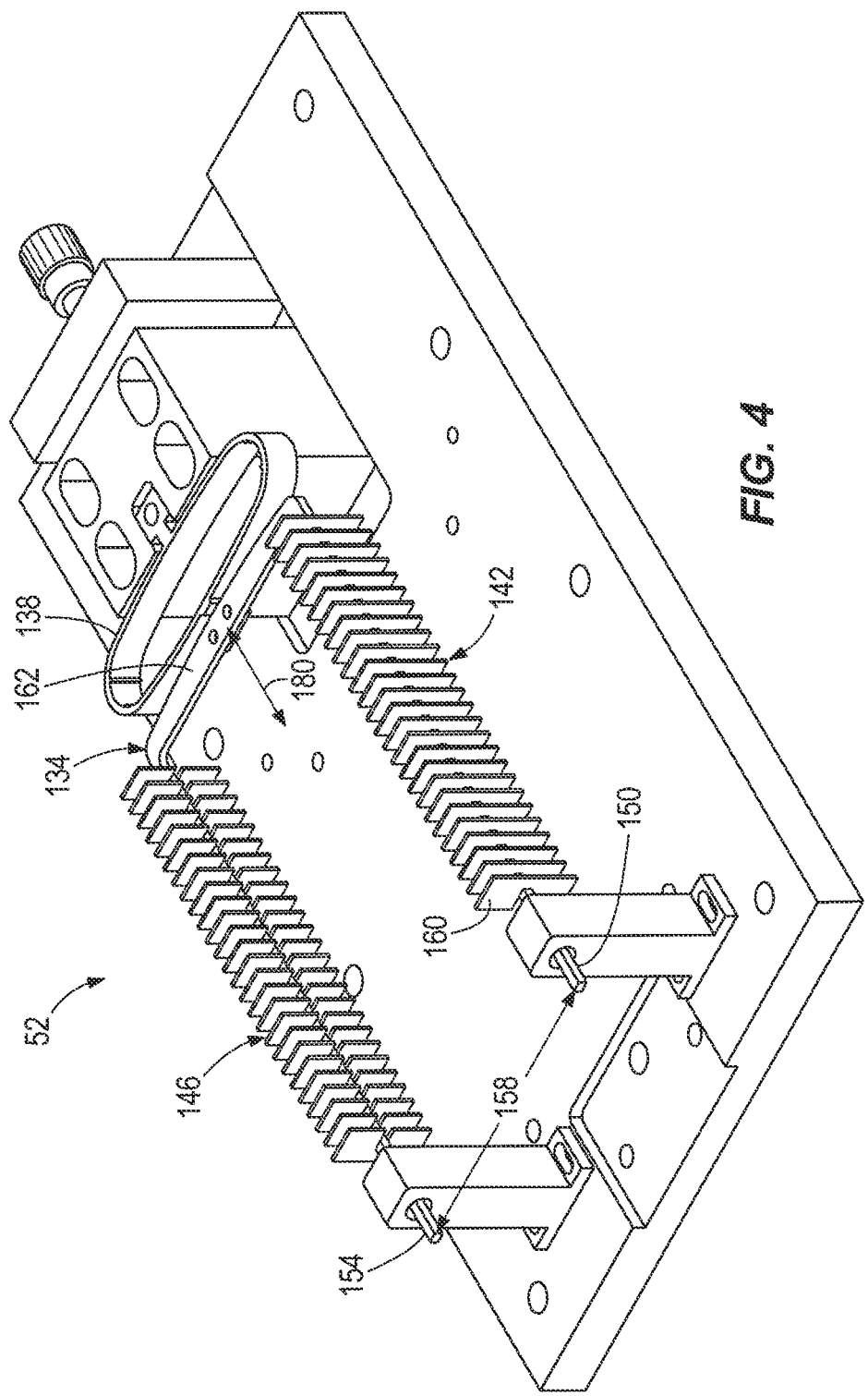
FIG. 4 is a perspective view of an agitator assembly of the heat transfer apparatus of FIG. 2.

FIG. 4 illustrates the agitator assembly 52. The agitator assembly 52 includes an agitator carrier 134, an agitator actuator 138, a first group of agitator members 142, and a second group of agitator members 146. The agitator carrier 134 includes a first carrier arm 150 and a second carrier arm 154. Referring to FIG. 2, the carrier arms 150 and 154 are spaced apart a distance 158 corresponding to a separation distance between the first agitator channel 102 and the second agitator channel 106, respectively, such that the carrier arms 150 and 154 may reciprocate without interference from the fin walls 76 of the heat sink assembly 48. Referring to FIG. 4, the first and second carrier arms 150 and 154 are coupled to a connecting portion 162. The connecting portion 162 is coupled to the agitator actuator 138.

Figure 3:
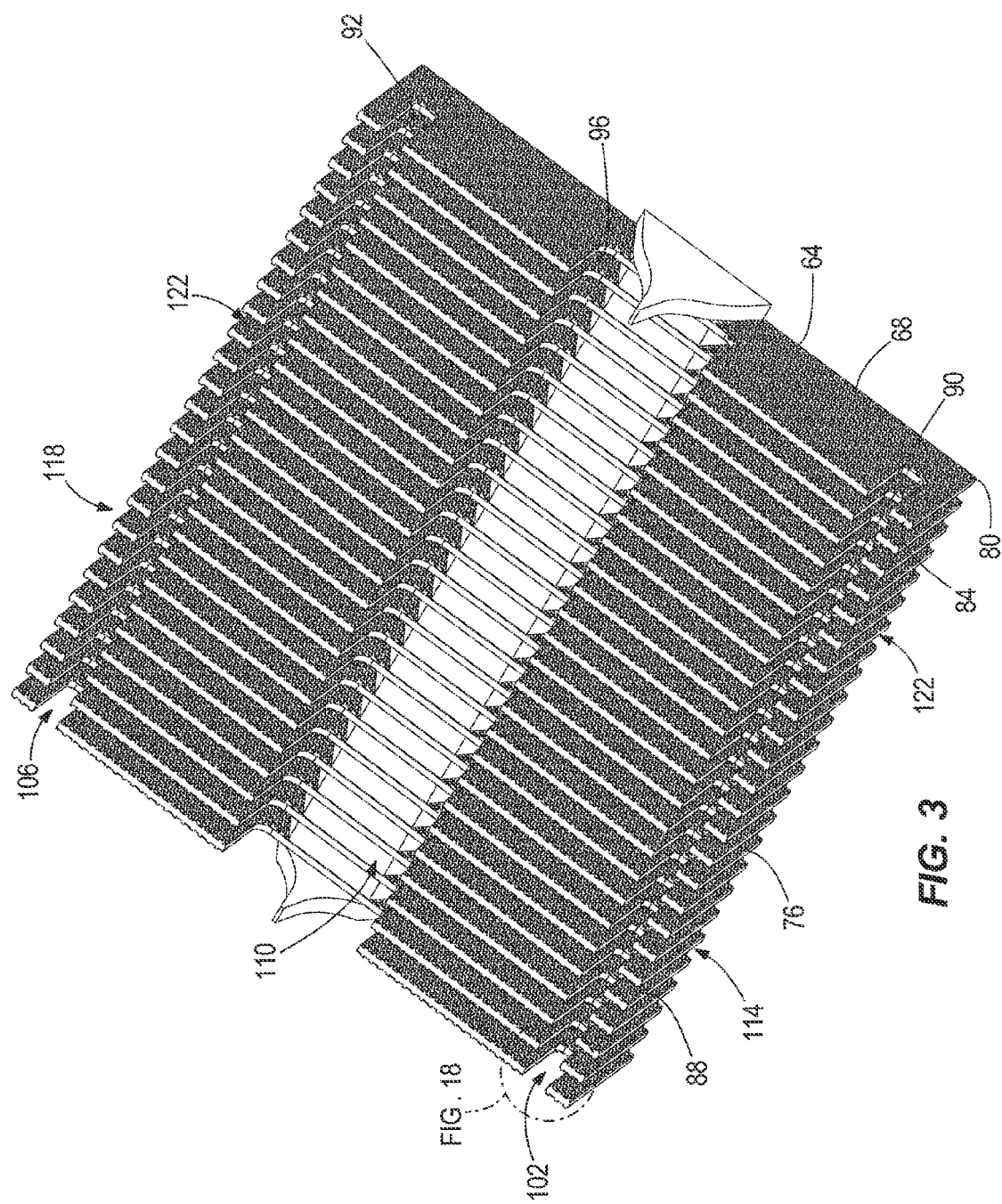
FIG. 3 is a perspective view of a heat sink of the heat transfer apparatus of FIG. 2.

The first group of agitator members 142 is coupled to the first carrier arm 150, and the agitator members 142 are spaced along the first carrier arm 150 to reciprocate between adjacent fin walls 76 of the heat sink 48 (FIGS. 2 and 3). Referring to FIG. 4, the second group of agitator members 146 is coupled to the second carrier arm 154, and the agitator members 146 are spaced to reciprocate between adjacent fin walls 76 of the heat sink 48 (FIGS. 2 and 3). Each agitator member 142 or 146 includes a substantially rectangular body 160, although other shapes are also possible, for example square, curved, triangle, or other shapes that promote movement of gas (e.g. air). In some embodiments, the body 160 of the agitator member 142 or 146 is approximately the same size and shape as the fin walls 76 (e.g. FIG. 3) while in other embodiments the body 160 is smaller (e.g. FIG. 4). In the latter case, the body 160 may be placed at a location where air or other gas enters the space between adjacent fin walls 76 to disrupt laminar air flow as air enters the space, where the disrupted flow pattern continues downstream of the body 160.

Figure 6:
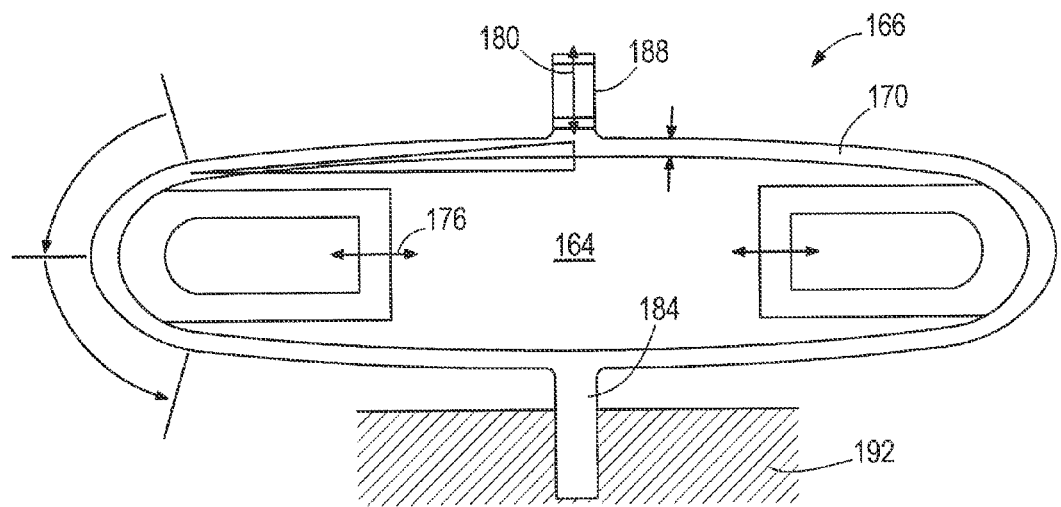
FIG. 6 is a side view of the agitator actuator of FIG. 5.

Referring to FIG. 5, the agitator actuator 138, includes a piezo stack 164. The piezo stack 164 is disposed within an amplification body 166. Referring to FIG. 6, the amplification body 166 includes an oval loop shell 170 having a primary displacement axis 176 and an agitation axis 180 that is substantially perpendicular to the primary displacement axis. A support leg 184 and an actuation leg 188 are substantially aligned with the agitation axis 180. The support leg 184 is fixedly coupled to a rigid support 192. The rigid support 192 may be the heat sink assembly 48 (FIG. 2), a surrounding cabinet, bulkhead, or other fixed structure. The actuation leg 188 is fixedly coupled to the connecting portion of the agitator carrier 150 (FIG. 4).

Referring to FIG. 6, expansion and contraction of the piezo stack 164 along the primary displacement axis 176 results in an amplified displacement along the agitation axis 180. Reciprocating displacement of the agitator carrier 134 (FIG. 4) along the agitation axis 180 results in the agitator members 142, 146 reciprocating between their corresponding, adjacent fin walls 76 (FIG. 2), generating secondary flow similar to that illustrated in FIG. 1. Other means for moving the agitators could also be used, including, for example, a rotating cam driving a piston or a linear actuator.

Synthetic jets are generated by creating a closed chamber with a flexible diaphragm and one or a limited number of openings to act as a nozzle when the diaphragm is moved, moving air through the nozzle(s). Several different mechanisms can be used to move the flexible diaphragm, as described below. Referring to FIG. 7, the synthetic jet assembly 56 includes a jet actuator 194, a diaphragm 196, and a jet body 198. The jet actuator 194 includes a piezo stack 202 disposed within an amplification body 204. The amplification body 204 includes an oval shell 206 having a primary displacement axis 210 and jet axis 214 that is substantially perpendicular to the primary displacement axis 210. A support leg 218 and an actuation leg 222 are substantially aligned with the jet axis 214. The support leg 218 is fixedly coupled to a rigid support, such as the blower assembly 60 (FIG. 2), a surrounding cabinet, bulkhead, or other fixed structure. The actuation leg 222 is fixedly coupled to the flexible diaphragm 196. Expansion and contraction of the piezo stack 202 along the primary displacement axis 210 results in an amplified displacement of the amplification body 204 along the jet axis 214. Other means for driving the synthetic jet diaphragm 196 could also be used, including, for example, a rotating cam driving a piston or a linear actuator.

Figure 9:
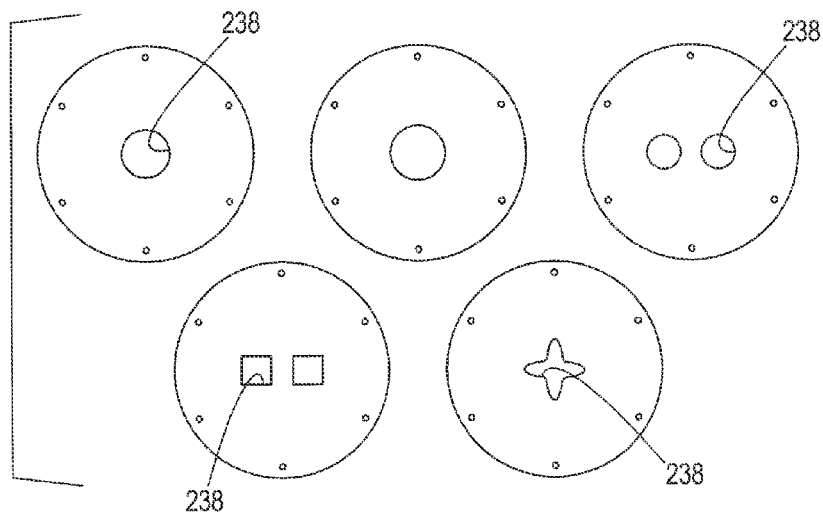
FIG. 9 is a planar view of various nozzle configurations of a synthetic jet assembly.

Referring to FIG. 8, the jet body 198 includes a diaphragm surface 226 and a nozzle surface 230. A cavity 234 is defined within the jet body 192 between the diaphragm surface 226 and the nozzle surface 230. An array of nozzles 238 is defined by the nozzle surface 230. Referring to FIG. 9, in various embodiments the nozzles 238 can have an opening with one or more shapes including circular, square, plus- or star-shaped.

Referring to FIGS. 7 and 8, when the amplification body 204 expands and contracts, the diaphragm 196 reciprocates along the jet axis 214. Movement of the diaphragm 196 at the diaphragm surface 226 creates pressure transients with the cavity 234, causing air or other fluids to be rapidly drawn into the cavity 234 and ejected from the cavity 234 through the nozzles 238 in a direction substantially parallel to the jet axis 214. The nozzles 238 are spaced apart such that the airflow is discharged upon the distal ends 84 of the fin walls 76 (FIG. 5), in a manner similar to the tertiary flow illustrated in FIG. 1.

Figure 10:
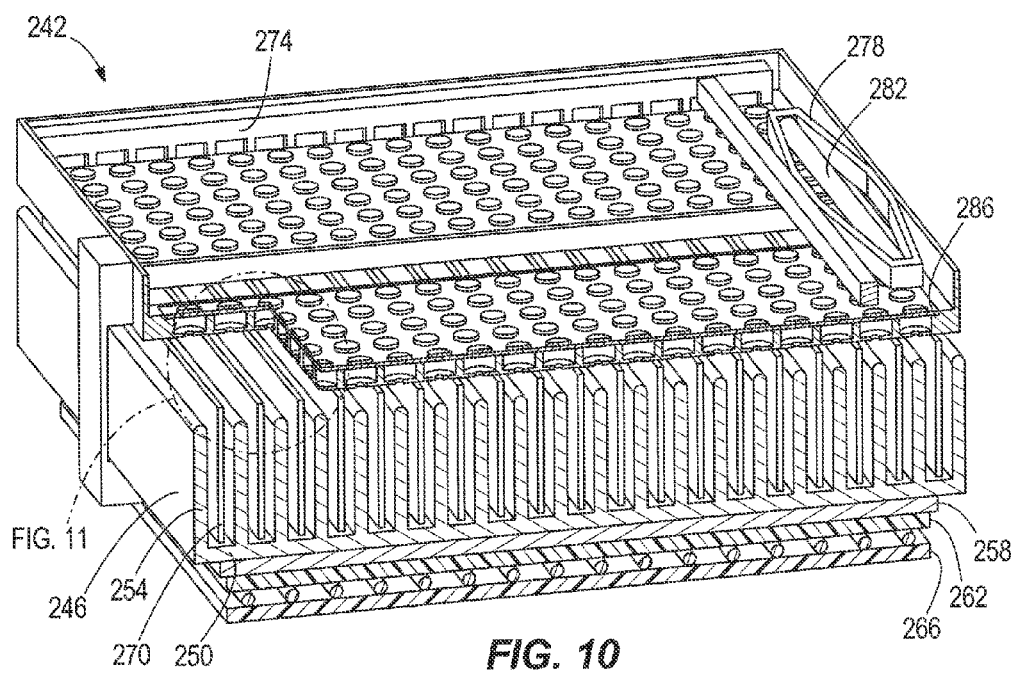
FIG. 10 is a perspective view of a heat transfer apparatus according to another aspect of the invention.

FIG. 10 illustrates a heat transfer apparatus 242 according to another embodiment of the invention. The heat transfer apparatus 242 includes a heatsink 246 with a base wall 250 and fin walls 254 extending from the base wall 250. The base wall 250 is coupled to a heat spreader 258. A microchip 262 is sandwiched between a chip carrier 266 and the heat spreader 258.

Figure 11:
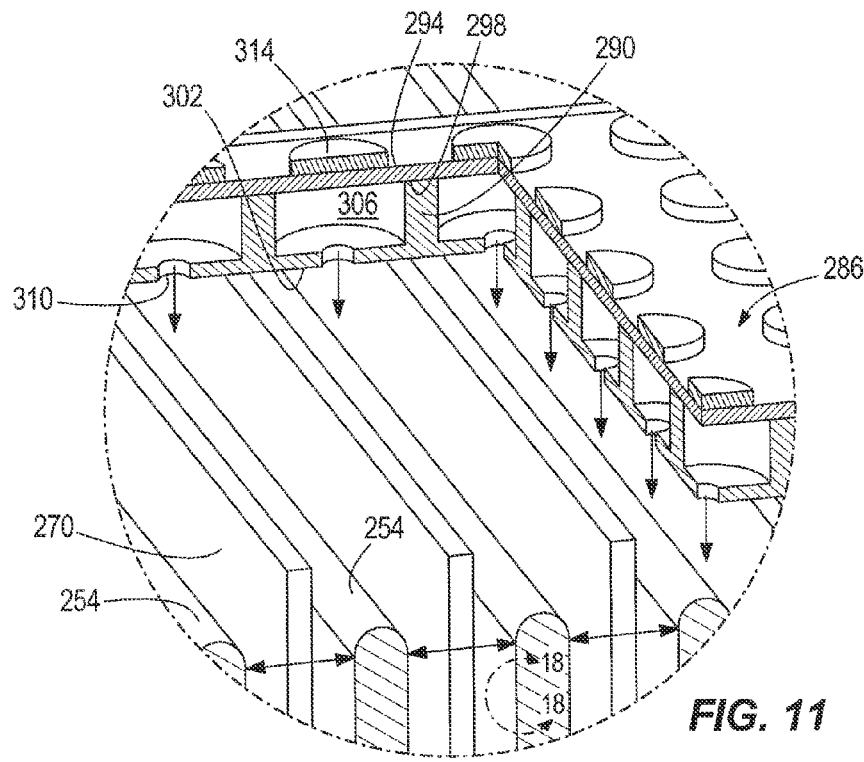
FIG. 11 is a detailed cutaway view of a portion of FIG. 10.

Agitator plates 270 are disposed between the fin walls 254. The agitator plates 270 are coupled to an agitator carrier 274. The agitator carrier 274 is coupled to an agitator actuator 278 including a piezo stack 282. Referring to FIG. 11, a synthetic jet assembly 286 includes a jet body 290 and a diaphragm 294. The jet body 290 includes a diaphragm surface 298 and a nozzle surface 302. An array of cavities 306 are defined within the jet body 290 between the diaphragm surface 298 and the nozzle surface 302, with a corresponding array of nozzles 310 (one per cavity 306) defined by the nozzle surface 302. The diaphragm 294 includes an array of piezo bender actuators 314, with one piezo bender actuator 314 substantially aligned with each cavity 306. When the piezo bender actuators 314 expand and contract, the diaphragm 294 reciprocates over cavities 306. This diaphragm movement creates pressure transients with the cavities 306, causing air or other fluids to be rapidly drawn into the cavity 306 and ejected from the cavity 306 upon the fin walls 254.

Figure 12:
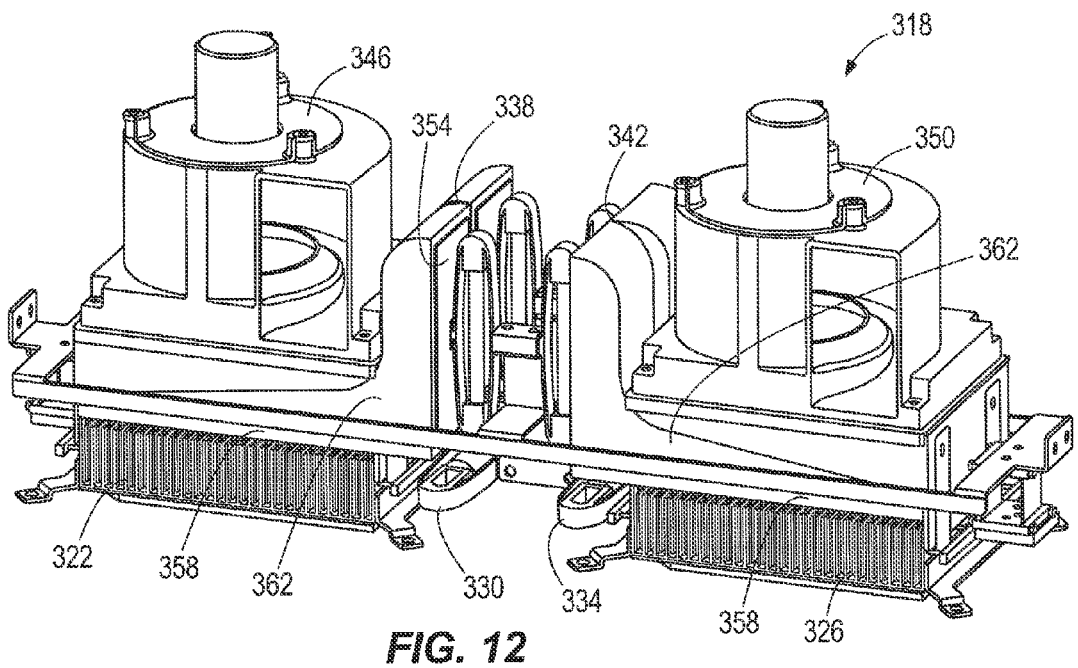
FIG. 12 is a perspective view of a dual heat transfer apparatus according to another aspect of the invention.

FIG. 12 illustrates a dual heat transfer apparatus 318 according to another aspect of the invention. The dual heat transfer apparatus 318 includes a first heat sink 322 and a second heat sink 326, a first agitator assembly 330 and a second agitator assembly 334, a first synthetic jet assembly 338 and a second jet assembly 342, and a first blower 346 and a second blower 350. Each of the first and second synthetic jet assemblies 338 and 342 includes a diaphragm 354 oriented substantially perpendicular to a synthetic jet body 358. Manifolds 362 fluidly connect each diaphragm 354 to its corresponding synthetic jet body 358.

Figure 13:
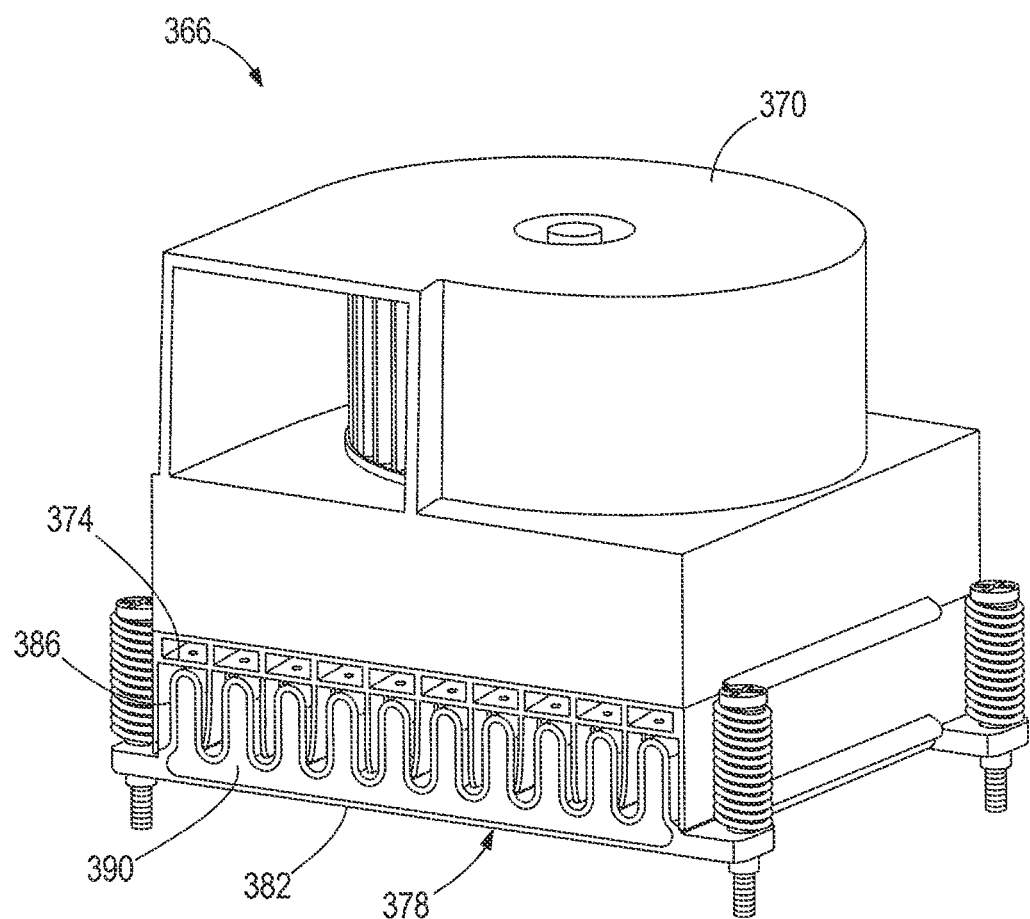
FIG. 13 is a perspective view of a heat transfer apparatus according to another aspect of the invention.
Figure 14:
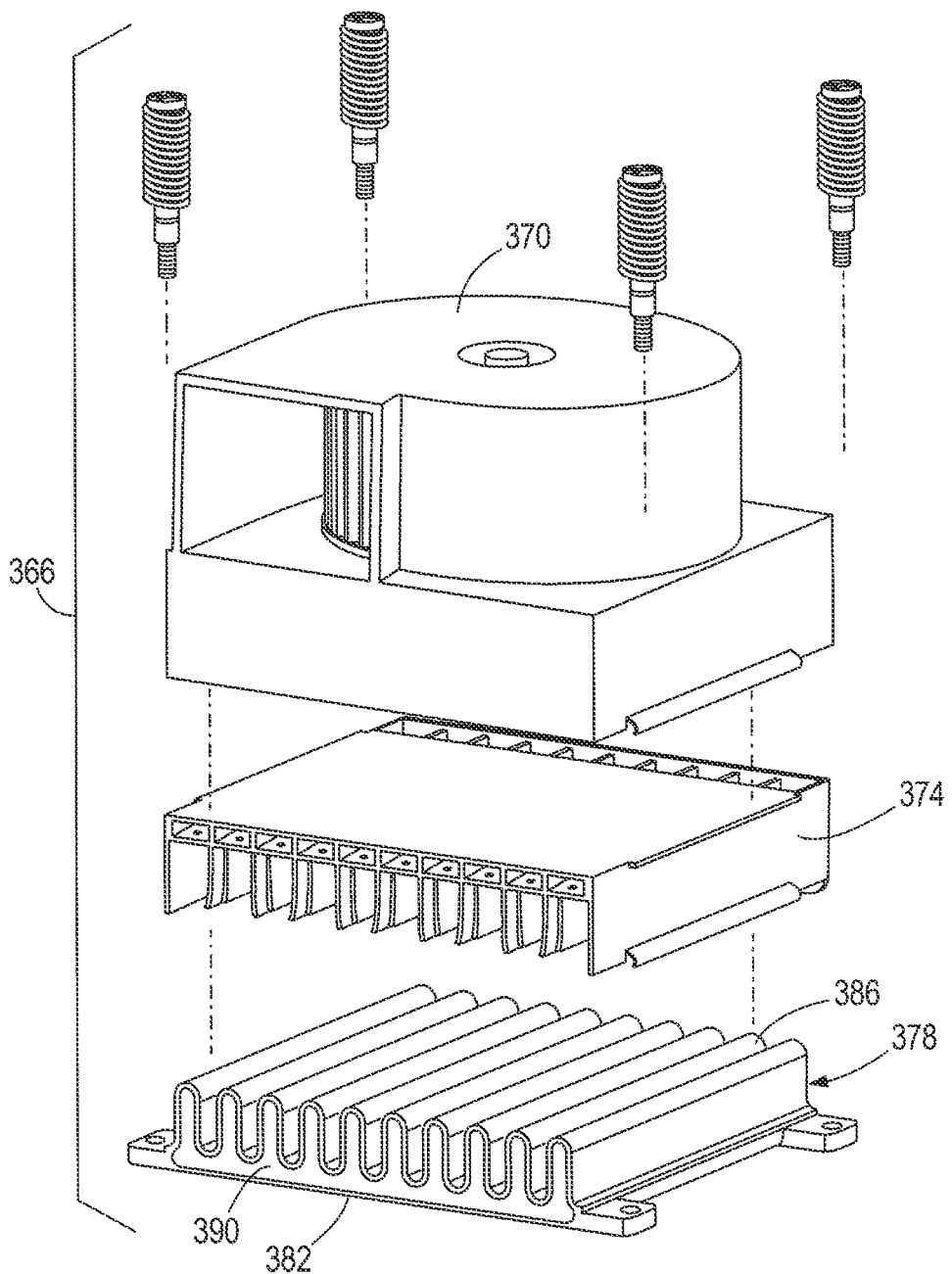
FIG. 14 is an exploded view of the heat transfer apparatus of FIG. 13.

FIGS. 13-14 illustrate a heat transfer apparatus 366 according to another aspect of the invention in which the heat transfer surface (e.g. one or more fins) is an outer wall of a heat pipe. The heat transfer apparatus 366 includes a blower assembly 370, an agitator and synthetic-jet assembly 374, and a heat pipe heat sink 378. The heat pipe 378 includes a base portion 382 and rib portions 386 (e.g. fins) extending from the base portion 382. The base portion 382 and rib portions 386 define a vapor chamber 390.

A heat pipe vapor chamber is a heat-transfer device that combines the principles of both thermal conductivity and phase transition. A liquid within the vapor chamber turns into a vapor by absorbing heat from a first surface (e.g. at the base portion). The vapor condenses back into a liquid at a cold surface (e.g., at the ribs), releasing the latent heat. The liquid then returns to the hot interface through capillary action where it evaporates once more and repeats the cycle. In addition, the internal pressure of the heat pipe can be set or adjusted to facilitate the phase change depending on the demands of the working conditions of the thermally managed system.

Figure 15:
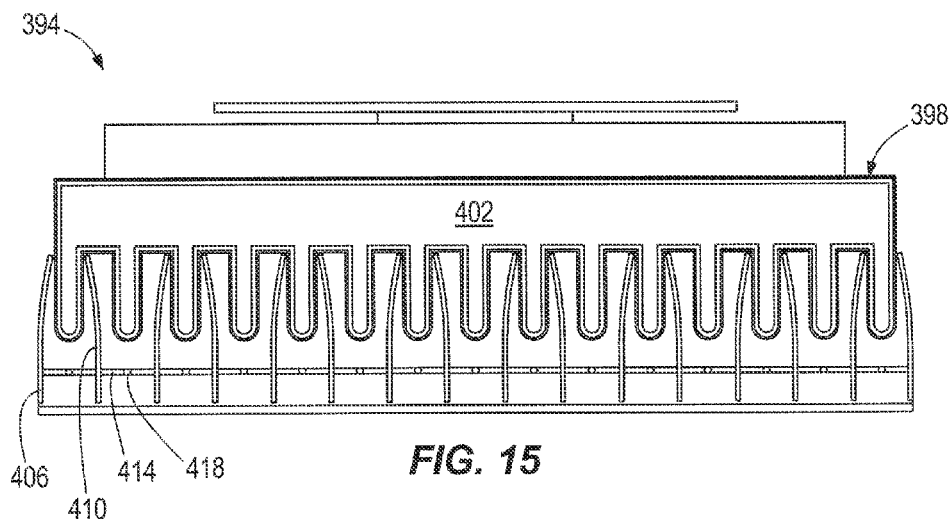
FIG. 15 is a cross-sectional view of a heat transfer apparatus according to another aspect of the invention.
Figure 16:
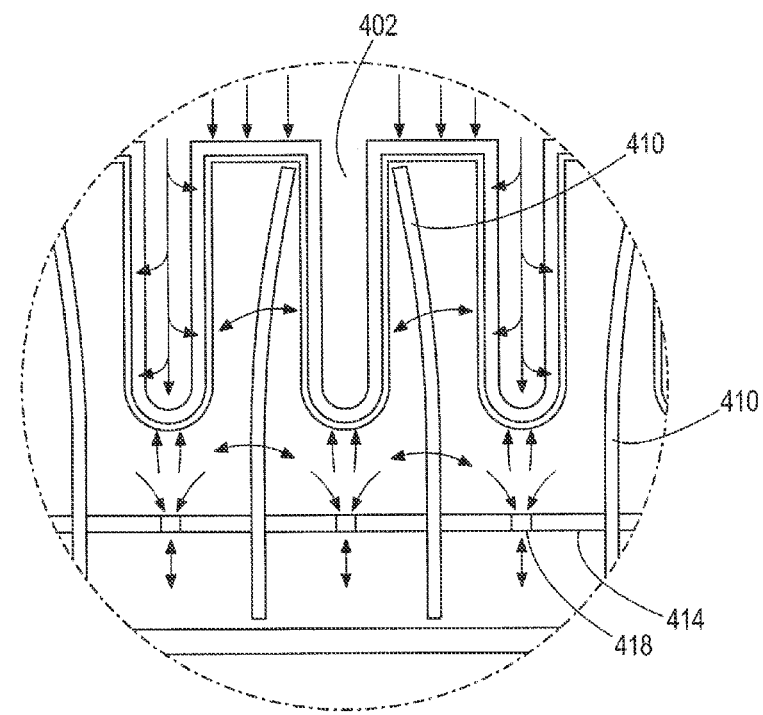
FIG. 16 is a detailed view of a portion of FIG. 15.

FIGS. 15-16 illustrates a heat transfer apparatus 394 according to another aspect of the invention. The heat transfer apparatus 394 includes a heat pipe 398 with a vapor chamber 402, similar to that described with respect to the heat transfer apparatus of FIG. 13. The heat transfer apparatus 394 includes a synthetic jet assembly 406 including piezo agitators 410. The piezo agitators 410 extend from a synthetic jet body 414, between adjacent nozzles 418 of the synthetic jet body 414.

Figure 17:
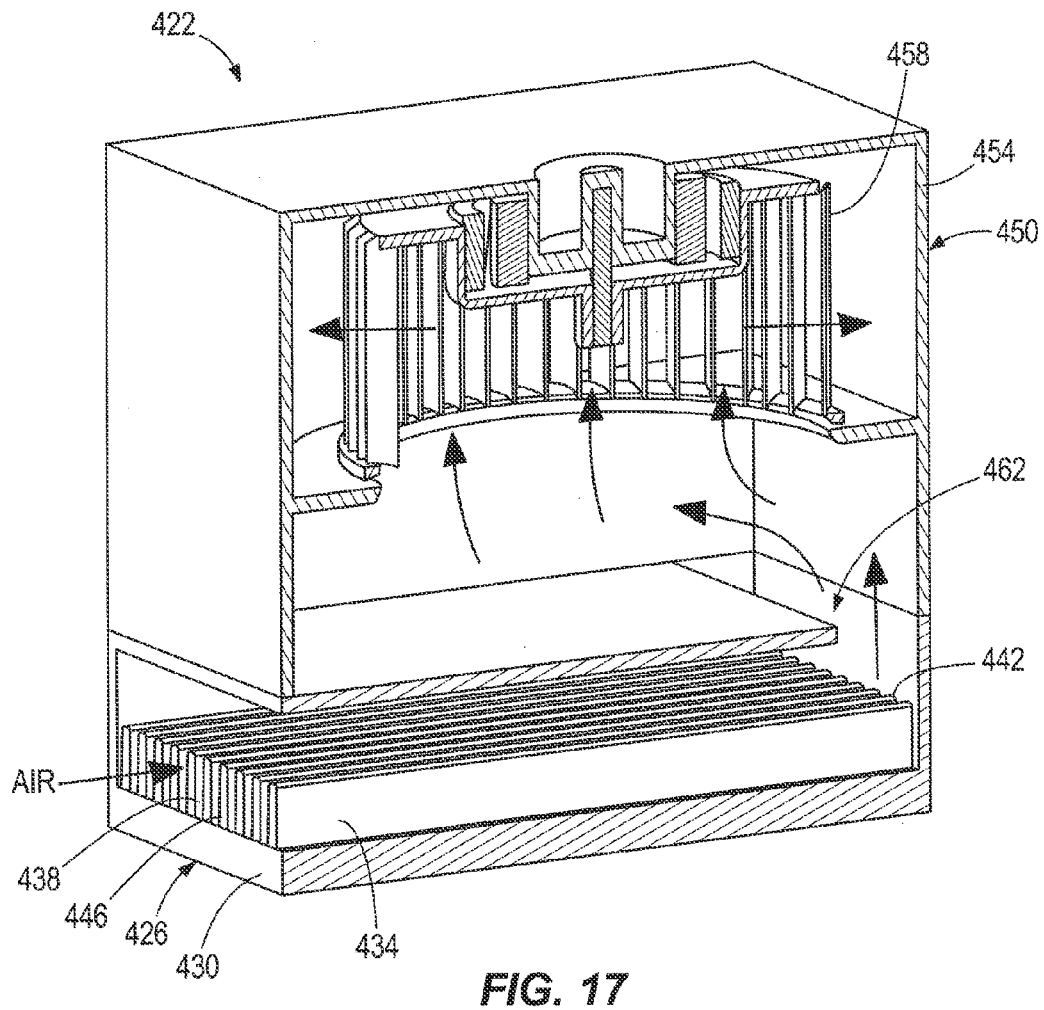
FIG. 17 is a cross-sectional view of a heat transfer apparatus according to another aspect of the invention.

FIG. 17 illustrates a heat transfer apparatus 422 according to yet another aspect of the invention. The heat transfer apparatus 422 includes a heat sink 426 with a base portion 430 and fin walls 434 extending from the base portion 430. The fin walls 434 have an inlet end 438 and an outlet end 442, with flow channels 446 defined between the fin walls 434 from the inlet end 438 to the outlet end 442. A blower assembly 450 includes a blower housing 454 and a centrifugal blower 458. The blower housing 454 includes a blower inlet 462 that receives air from the fin wall outlet end 442. When in operation, the centrifugal blower 458 draws air or other fluids through the flow channels 446 of the heat sink 426, from the inlet end 438 to the outlet end 442. The air is then redirected through the blower inlet 462 and into the centrifugal blower 458.

Figure 18:
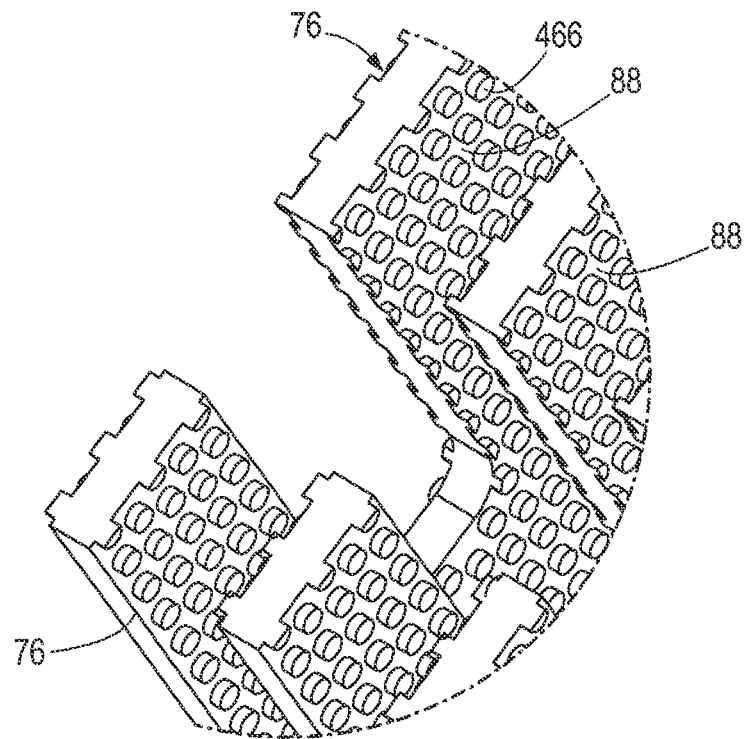
FIG. 18 is a detailed perspective view of a portion of FIG. 3.
Figure 19:
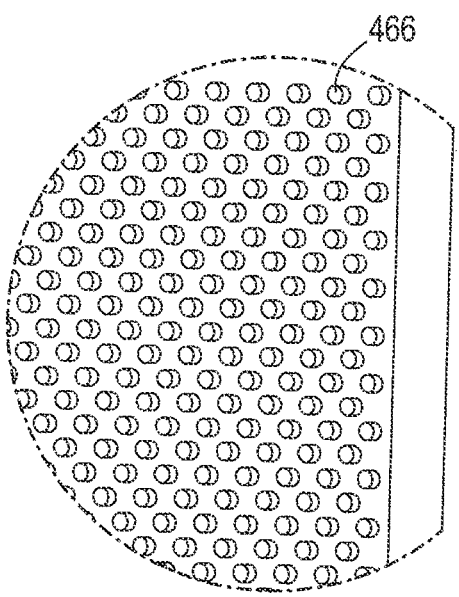
FIG. 19 is a detailed view of a portion of FIG. 11.

Referring to FIGS. 18 and 19, the heat transfer surfaces in some embodiments (e.g., FIG. 3) include an array of surface modification members 466 or pin fins. As discussed above, the surface modification members 466 are believed to disrupt or substantially reduce laminar flow across the heat transfer surface and are sized and shaped for optimal use with gases (in particular air) as the fluid for heat removal.

Figure 20:
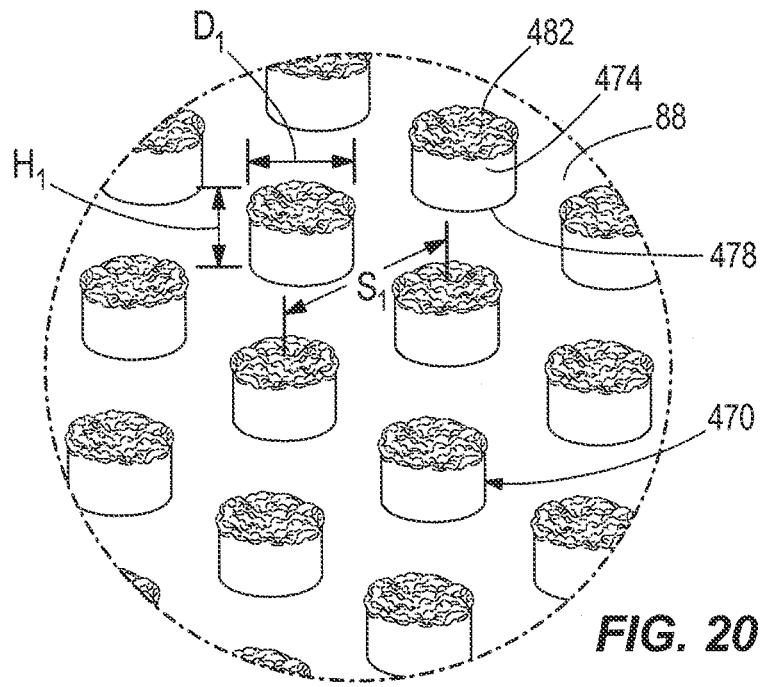
FIG. 20 is a perspective view of an array of surface modification members according to one aspect of the invention.
Figure 21:
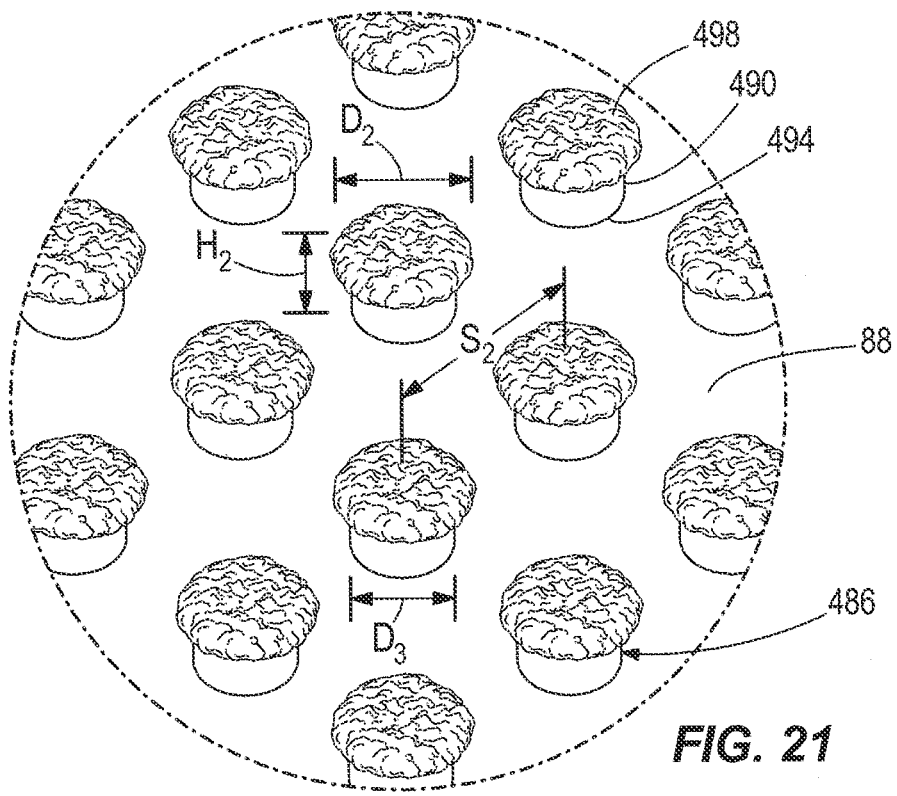
FIG. 21 is a perspective view of an array of surface modification members according to another aspect of the invention.

FIGS. 20 and 21 illustrate two embodiments of the surface modification members. FIG. 19 illustrates the surface modification members in a cylindrical pin fin configuration 470. Although cylindrical (i.e. having a circular cross-section) pin fins 470 are illustrated, the pin fins 470 can have a variety of shapes, for example having cross-sections that are oval, triangular, square, or other regular or irregular polygon or curved shapes. The cylindrical pin fins 470 include a cylindrical body 474 with a base end 478 and a distal end 482. The base end 478 is coupled to the heat transfer surface 88 (the substrate). The cylindrical pin tins have a height from the substrate of $H_1$ and diameter of the cylindrical body $D_1$. In one embodiment, the diameter $D_1$ is approximately 500 micrometers, with a height $H_1$ of approximately 250 micrometers. In another embodiment, the diameter $D_1$ is approximately 75 micrometers, with a height $H_1$ of 150 micrometers.

The spacing of the pin fins can influence the heat removal performance of the surface to which the pin fins are attached. The cylindrical pin fins 470 are separated from each other by a distance $S_1$. A ratio of the separation distance $S_1$ to the diameter $D_1$ (i.e., $S_1:D_1$) is approximately 6:1.

FIG. 21 illustrates the surface modification members in which the pin fins have an overall shape resembling a mushroom. The mushroom-shaped pin fins 486 include a cylindrical body 490 with a base end 494 and a distal end with a dome-shaped end-cap 498. The base end 494 is coupled to the heat transfer surface 88 (the substrate). Although the end-caps 498 are shown as being dome-shaped, other end-cap shapes are possible including a pin fin with an overall tapered shape, with the general property that the distal ends of the pin fins have a larger width than the width of the base. The end-cap 498 has a height $H_2$ from the substrate and a maximum diameter (at the end cap) $D_2$ and a base diameter (at the base end) of $D_3$. In one embodiment, the diameter $D_2$ is approximately 500 micrometers, the diameter $D_3$ is approximately 50-65 micrometers, with a height $H_2$ of approximately 250 micrometers. In another embodiment, the diameter $D_2$ is approximately 75 micrometers, the diameter $D_3$ is approximately 50-65 micrometers, with a height of 150 micrometers. A ratio of the separation distance $S_2$ to the diameter $D_2$ (i.e., $S_2:D_2$) is approximately 6:1.

Figure 22:
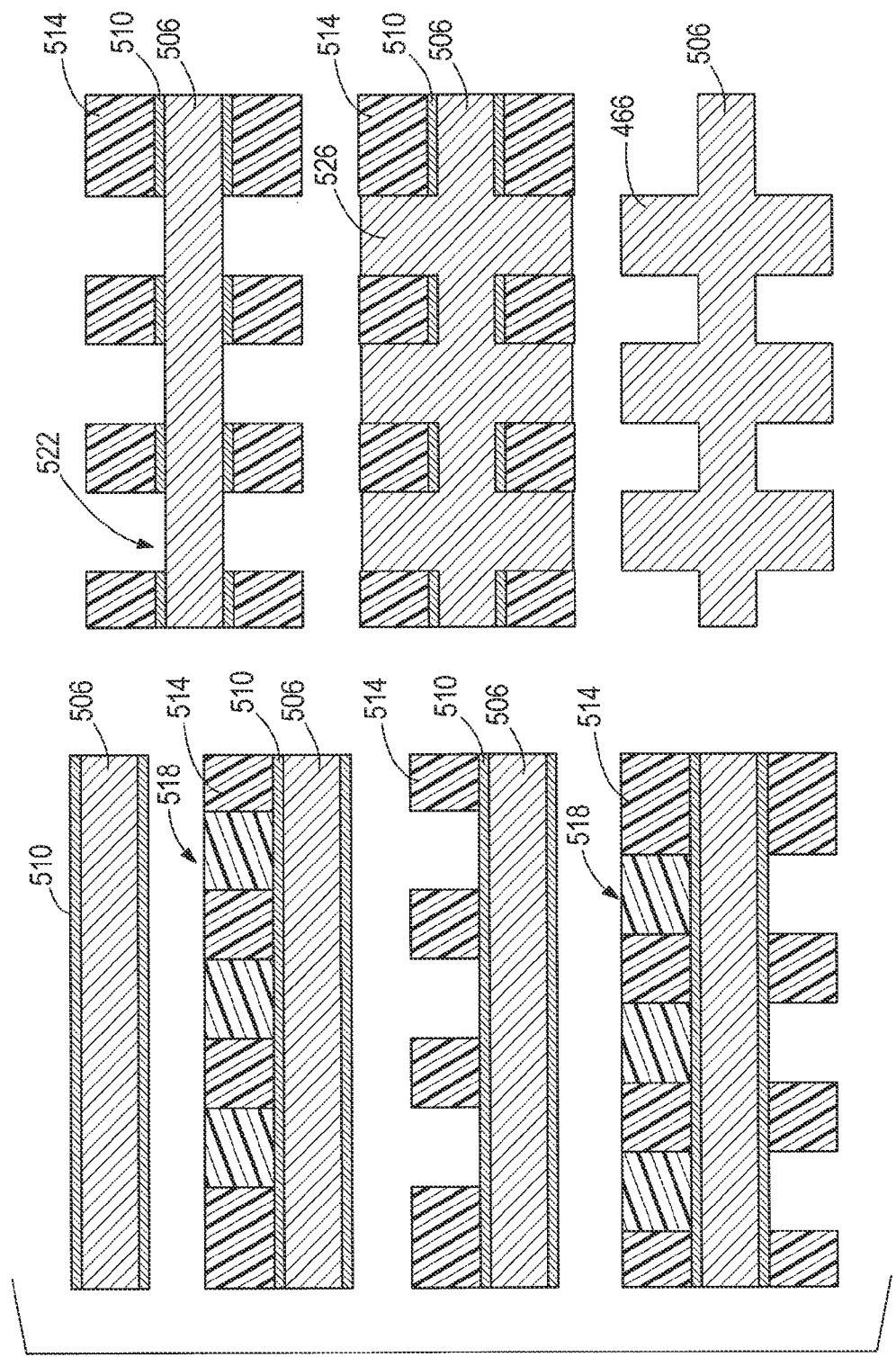
FIG. 22 illustrates a process for manufacturing surface modification members on a substrate.

FIG. 22 illustrates a method of fabricating surface modification members 466 on a first surface and a second surface of a copper substrate 506 (e.g., a copper fin wall). First, a titanium (Ti) layer 510 is deposited over the fin wall 506. Next, a high contrast, epoxy based photo resist 514 (e.g., KMPR®) is applied over the Ti layer 510. The photo resist 514 is selectively cured to establish a mold pattern 518, and the unexposed photo resist 514 is washed away. After removal of the unexposed photo resist 514, the Ti layer 514 is washed away from mold areas 522, selectively exposing the copper substrate 506 in the mold pattern. Copper plating 526 is then applied to the exposed copper substrate 506, thereby forming the surface modification members 466. Finally, the remaining cured photo resist 514 and titanium 510 is washed away, leaving only the copper substrate 506 and surface modifications 466.

Thus, the invention provides, among other things, a heat transfer apparatus. Various features and advantages of the invention are set forth in the following claims.

What is claimed is:

1. A heat transfer apparatus, comprising:
   a first wall having first base portion, a first end portion, and a first surface extending between the first base portion and the first end portion;
   a second wall having a second base portion, a second end portion, and a second surface extending between the second base portion and the second end portion, the first surface and the second surface at least partially defining a channel for heat exchange between a heat source, the heat source thermally coupled to the first wall and the second wall, and a fluid;
   a first fluid driver driving a first portion of the fluid through the channel in a first direction;
   a second fluid driver driving a second portion of the fluid through the channel in a second direction; and
   a third flow fluid driver driving a third portion of the fluid through the channel in a third direction, wherein each of the first direction, the second direction, and the third direction are substantially non-parallel.

2. The heat transfer apparatus of claim 1, wherein the first fluid driver comprises a blower for bulk fluid flow, the first direction being substantially parallel to the first surface and the second surface.

3. The heat transfer apparatus of claim 2, wherein the second fluid driver comprises a synthetic jet with a nozzle disposed adjacent the first end portion.

4. The heat transfer apparatus of claim 3, wherein the second direction is substantially parallel to the first surface.

5. The heat transfer apparatus of claim 3, wherein the second fluid driver further comprises a second synthetic jet with a nozzle disposed adjacent the second end portion.

6. The heat transfer apparatus of claim 3, wherein the third flow fluid driver comprises a reciprocating agitator.

7. The heat transfer apparatus of claim 6, wherein the reciprocating agitator comprises a piezo actuator.

8. The heat transfer apparatus of claim 6, wherein reciprocating agitator is actuated along an axis substantially perpendicular to the first direction.

9. The heat transfer apparatus of claim 1, wherein the first surface comprises a plurality of turbulence-inducing members.

10. The heat transfer apparatus of claim 1, wherein the fluid is a gas.

11. The heat transfer apparatus of claim 1, wherein the fluid is air.

* * * * *